(12) United States Patent
Velders et al.

(10) Patent No.: US 9,733,323 B2
(45) Date of Patent: Aug. 15, 2017

(54) NUCLEAR MAGNETIC RESONANCE (NMR) SPECTROSCOPY DEVICE

(71) Applicant: Wageningen Universiteit, Wageningen (NL)

(72) Inventors: Aldo Hendrikus Velders, Wageningen (NL); Raluca Maria Fratila, Enschede (NL); Maria Victoria Gomez Almagro, Enschede (NL); Stanislav Sykora, Castano Primo (IT)

(73) Assignee: Wageningen Universiteit, Wageningen (NL)

( * ) Notice: Subject to any disclaimer, the term of this patent is extended or adjusted under 35 U.S.C. 154(b) by 590 days.

(21) Appl. No.: 14/367,547

(22) PCT Filed: Dec. 21, 2012

(86) PCT No.: PCT/NL2012/050914
§ 371 (c)(1),
(2) Date: Jun. 20, 2014

(87) PCT Pub. No.: WO2013/095141
PCT Pub. Date: Jun. 27, 2013

(65) Prior Publication Data
US 2015/0008922 A1 Jan. 8, 2015

(30) Foreign Application Priority Data

Dec. 22, 2011 (NL) ...................... 2008016

(51) Int. Cl.
*G01V 3/00* (2006.01)
*G01R 33/36* (2006.01)
(Continued)

(52) U.S. Cl.
CPC ............. *G01R 33/36* (2013.01); *G01R 33/30* (2013.01); *G01R 33/302* (2013.01);
(Continued)

(58) Field of Classification Search
CPC ....................................................... G01R 33/36
(Continued)

(56) References Cited

U.S. PATENT DOCUMENTS 6,788,061 B1   9/2004  Sweedler et al.
9,261,470 B2 *  2/2016  Prado .................. G01N 24/082
(Continued)

FOREIGN PATENT DOCUMENTS

EP        1918730 A1    5/2008

OTHER PUBLICATIONS

Murphree et al: "An easily constructed, tuning free. ultra-broadband probe for NMR", Journal of Magnetic Resonance. vol. 188. No. 1. Sep. 1, 2007. pp. 160-167. XP022239825. Academic Press. Orlando. FL. us.
(Continued)

*Primary Examiner* — Louis Arana
(74) *Attorney, Agent, or Firm* — Banner & Witcoff, Ltd.

(57) ABSTRACT

The invention relates to a Nuclear Magnetic Resonance (NMR) spectroscopy device adapted for carrying out 1D and nD homo- and heteronuclear NMR spectroscopy measurements of a plurality of nuclei, comprising an RF coil adapted to transmit RF to and/or receive RF from a measuring volume, wherein the RF coil forms part of a non-tuned radiofrequency circuit. The invention further relates to a method of NMR data acquisition, a method of manufacturing a NMR spectroscopy device and a NMR-device holder.

13 Claims, 7 Drawing Sheets

(51) Int. Cl.
G01R 33/30 (2006.01)
G01R 33/46 (2006.01)
G01R 33/34 (2006.01)
G01R 33/465 (2006.01)

(52) U.S. Cl.
CPC ... *G01R 33/34092* (2013.01); *G01R 33/3635* (2013.01); *G01R 33/46* (2013.01); *G01R 33/465* (2013.01)

(58) Field of Classification Search
USPC .......................................... 324/322, 318, 314
See application file for complete search history.

(56) References Cited

U.S. PATENT DOCUMENTS

2008/0258731 A1* 10/2008 Smith .................... H01Q 7/005
                                                          324/322
2015/0260813 A1*  9/2015 Mandal ................... G01V 3/32
                                                          324/322
2016/0291191 A1* 10/2016 Fukushima ......... G01R 33/3415

OTHER PUBLICATIONS

Fratila R M et al: "Small-volume nuclear magnetic resonance spectroscopy". Annual Review of Analytical Chemistry. vol. 4. Jul. 19, 2011. pp. 227-249.V-VI. XP002679516. Annual Reviews INC. USA.

Lowe I J et al: "A high-power. untuned radio-frequency transmitter for pulsed nuclear magnetic resonance spectroscopy". Journal of Scientific Instruments. vol. 1. Jun. 1968. pp. 604-606. XP002679551. (Journal of Physics E) UK.

Smith J. et al.: "Surface coils with integrated differential amplifiers". Proceedings of the International Society for Magnetic Resonance in Medicine. 14TH Meeting Proceedings. May 6, 2006. pp. 2618. XP002679552. Seattle. Washington. USA.

Pollak V L et al: "Input circuits for pulsed N.M.R". Review of Scientific Instruments. vol. 37. No. 3. Mar. 1966. pp. 268-272. XP002679553. USA.

Hopper T et al: "Low-frequency NMR with a non-resonant circuit". Journal of Magnetic Resonance. vol. 210. No. 1. May 2011. pp. 69-74. XP002679554. Academic Press Inc. USA.

International Search Report—PCT/NL2012/050914—Mailing date: Mar. 13, 2013.

* cited by examiner

NUCLEAR MAGNETIC RESONANCE (NMR) SPECTROSCOPY DEVICE

CROSS-REFERENCE TO RELATED APPLICATIONS

This application is a U.S. National Stage application under 35 U.S.C. §371 of International Application PCT/NL2012/050914 (published as WO 2013/095141 A1), filed Dec. 21, 2012, which claims priority to Application NL 2008016, filed Dec. 22, 2011. Benefit of the filing date of each of these prior applications is hereby claimed. Each of these prior applications is hereby incorporated by reference in its entirety.

FIELD OF THE INVENTION

The invention relates to a Nuclear Magnetic Resonance (NMR) spectroscopy device.

The invention further relates to a method of carrying out simultaneous Nuclear Magnetic Resonance (NMR) spectroscopy measurements of a plurality of nuclei.

The invention still further relates to a network.

The invention still further relates to a method of manufacturing of a Nuclear Magnetic Resonance (NMR) spectroscopy device.

The invention still further relates to a NMR-device holder for allowing hosting of a fluidic chip.

BACKGROUND OF THE INVENTION

Analyzing a sample and detecting its components may be critical in many areas of science, particularly (bio)(medical) chemistry. The sample to be analyzed, usually referred-to as "analyte" typically is initially separated into its components and then each component is analyzed for identification.

Analyzing the sample can be accomplished in a variety of ways. For example a Nuclear Magnetic Resonance spectrometer may be used, which may provide information about molecular composition of the sample.

An embodiment of a Nuclear Magnetic Resonance (NMR) spectroscopy device is known from U.S. Pat. No. 6,788,061. The known device comprises an analyte sample holder having a containment region arranged for holding a volume of the sample for investigation, and a coil enclosing the containment region. The device further comprises a magnet for maintaining a permanent magnetic field in the containment region, wherein the coil is arranged to transmit or receive the RF energy to and from the analyte sample provided in the containment region.

In the known device the RF microcoil may be used to detect analytes during capillary electrophoresis. Accordingly, the microcoil may be wrapped around the capillary. The known device further comprises an electrical circuit which is associated with the microcoil for enabling the microcoil to transmit and to receive energy. The detection circuit of the known device comprises an impedance matched circuit for ensuring that the microcoil is tuned to a particular narrow bandwidth. Therefore, the known device is operable for detecting a particular analyte whose response may be expected in the bandwidth for which the microcoil is tuned.

It is a disadvantage of the known device that only one specific kind of nuclei may be analyzed in the known device. Should it be required to detect a presence of two or more different kinds of nuclei in the sample, the tuning circuit should be adapted and the data acquisition should be repeated.

A further embodiment of a NMR spectroscopy device is known from EP 1 918 730. The known device relates to a flow-through microfluidic NMR chip, which is adapted to facilitate NMR-spectroscopic measurements using an extended coil. The extended coil has a larger dimension in the direction of $B_0$-filed than its dimension in an orthogonal direction.

In an embodiment of the known device it comprises a plurality of coils, each coil being tuned to its own dedicated frequency. This arrangement is used for facilitating multi-nuclide data acquisition.

It is a disadvantage of the known device that a complicated architecture is required for enabling the multi-nuclide data acquisition.

SUMMARY OF THE INVENTION

It is an object of the invention to provide an NMR spectroscopy device which is capable to carry out acquisition of spectroscopy data for a plurality of nuclei simultaneously or sequentially without tuning or matching.

To this end the device according to the invention comprises a Nuclear Magnetic Resonance (NMR) spectroscopy device adapted for carrying out one dimensional and/or multidimensional heteronuclear spectroscopy measurements of a plurality of nuclides, comprising an RF coil adapted to transmit RF radiation to and/or receive RF radiation from a measuring volume, wherein the RF coil is arranged to connect to and to form part of a non-tuned radiofrequency circuit.

It will be appreciated that in the field of NMR spectroscopy the non-tuned circuit is understood as a circuit comprising no capacitor connected in parallel with the RF coil.

It will be appreciated that the NMR device according to the invention may be adapted to be used as an insert into a conventional magnetic resonance apparatus having a dedicated magnet for generating a constant magnetic field $B_0$ in the measuring volume. Alternatively, the NMR device according to the invention may comprise a magnet for maintaining a substantially constant magnetic field in the measuring volume.

It is found that when the coil is provided in a non-tuned configuration a broadband operation is feasible enabling either sequential or simultaneous detection of all NMR-responsive nuclides, that is the nuclides having Larmor precession frequencies in the range of at least 40 ($^{15}$N) to at least 400 ($^1$H) MHz when operating at 9.4 T, and correspondingly lower or higher frequencies when lower, respectively, higher magnetic fields are used. As a result, the NMR device accordingly to the aspect of the invention is a broad-band device, having a broad-band RF coil to which RF pulses can be applied with different carrier frequencies, either in sequence or simultaneously, allowing sophisticated one-dimensional (1D) or multi-dimensional (nD) heteronuclear NMR experiments. The 1D experiment results in a direct-detected nuclide spectrum, whilst the nD experiment provides plots in which one axis corresponds to the direct-detected nuclide and (n−1) axes corresponding to the indirectly-detected nuclides.

Accordingly by using a single broad-band RF coil a cheap alternative may be provided to the commercial NMR (micro-)probe systems, in application as (cryogen-free) table-top NMR systems, in in-flow monitoring of chromatographic separation and lab-on-a-chip processes. In addition, further downscaling to bacteria and biomarker detection may be enabled, as well as intracellular protein identification.

Using non-tuned broad-band coils will dramatically improve the accessibility of the NMR techniques, such as spectroscopy and imaging. For example, it will make it possible to dock to the same coil any number of fully functional transmit/receive channels with the possibility to excite and detect simultaneously any number of nuclides. Alternatively, the device makes it possible to superpose a number of transmit/receive channels with different carrier frequencies.

In an embodiment of the NMR device according to the invention the RF coil is further arranged to connect to and to form part of a non-matched radiofrequency circuit.

It will be appreciated that in the field of NMR spectroscopy the non-matched circuit is understood as a circuit comprising no matching capacitor connected in series with the RF coil.

The present aspects of the invention are based on the following insights. A classical NMR front-end may comprise a transmit/receive coil enveloping the sample and a tuning/matching circuit driven through a $Z_0$ (usually 50Ω) coaxial cable, such as an embodiment known from U.S. Pat. No. 6,788,061. On pulsed instruments, one usually uses a circulator based on a λ/4 cable and crossed diodes to isolate the transmitter from the preamplifier during the pulse, as well as from the coil during signal reception.

For multi-frequency channel probes this implies multiple coils and/or multi-dip tuning circuits, making the probes very complex.

In accordance with the present aspects of the invention a broad-band coil NMR device is provided which is directly coupled to a coaxial cable, i.e. without any tuning or matching capacitors. It is found that such coil has good operational characteristics over substantially the full RF band, allowing homo- and heteronuclear, mono- and multi-dimensional NMR experiments using the same front-end (see FIGS. 3-6 depicting data for $^1H^{13}C$-HSQC and the $^{19}F^{31}P$-HSQC), also allowing decoupling of non-direct-detected nuclides.

In a further embodiment of the NMR device according to a further aspect of the invention, the RF coil has a detection volume of less than 1 milliliter, preferably less than 100 microliter, more preferably less than 1 microliter, even more preferably less than 100 nanoliter.

It is found that a detection volume of 25 nL can be achieved with the device according to the invention, wherein the sample may be contained in a 500 micrometer deep microfluidic channel at a distance of less than 1 centimeter, preferably less than 1 millimeter, more preferably less than 100 micrometers from the transceiver coil. It will be appreciated that in the device according to the invention either a transceiver coil may be used or a dedicated transmit-coil and a dedicated receive coil. A particular embodiment of the NMR spectroscopy device according to an aspect of the invention will be discussed in more detail with reference to FIG. 1.

The device comprises a sample container and an RF coil. Preferably, the device is chip-based, the RF coil being a micro-coil provided on the chip. More preferably, the chip forms part of a fluidic device.

In an embodiment of the device according to the invention the device is adapted to carry out one-dimensional (1D) or multidimensional (nD) measurements. It will be appreciated that the term 'multidimensional measurements' relates to at least two-dimensional and three-dimensional data acquisition.

It is found that the broad-band nature of the RF coil provided in the NMR spectroscopy device according to the invention allows for heteronuclear experiments to be run in heteronuclear decoupling mode during acquisition, in 1D as well as in nD experiments. Heteronuclear 1D operation of the device will be discussed in more details with reference to FIG. 3, and multidimensional operation of the device according to the invention will be discussed in more details with reference to FIGS. 4-6.

In a still further embodiment of the NMR spectroscopy device according to a still further aspect of the invention the RF coil is arranged to communicate with a plurality of measurement channels, each channel operating at the specific Larmor frequency of a specific a nuclide.

In a still further embodiment of the NMR spectroscopy device it comprises a plurality of coils, which are adapted to be addressed sequentially and/or contemporaneously. The said plurality of coils can be part of the same or separate RF circuits. The said plurality of coils can be likewise part of a non-tuned or non-tuned and non-matched radiofrequency circuit.

The network according to an aspect of the invention comprises the device as is set forth in the foregoing. For example, the network may further comprise a suitable lab-on-chip device next to the device as is set forth in the foregoing.

A method of carrying out Nuclear Magnetic Resonance (NMR) one dimensional and/or multidimensional heteronuclear spectroscopy measurements of a plurality of nuclides, according to an aspect of the invention, comprises the steps of:

providing a sample comprising a plurality of nuclides in a measuring volume of an NMR spectroscopy device having:
  i) a constant magnetic field in the measuring volume and
  ii) an RF coil adapted to transmit and/or receive RF radiation to, respectively, from the measuring volume, wherein the RF coil is arranged to form part of a non-tuned radiofrequency circuit;

executing a data acquisition sequence on the NMR device;

acquiring data from the sample pursuant to the said acquisition sequence.

It will be appreciated that on one device multiple coils can be present, which can be addressed sequentially and/or contemporaneously. Both coils can be part of a non-tuned or non-tuned and non-matched radiofrequency circuit, or one of them can be tuned to a specific Larmor frequency. In an embodiment, a suitable data acquisition sequence may comprise sequences including irradiation on one of the nuclides' Larmor frequencies, for NOE A method of manufacturing of a NMR spectroscopy device comprising the steps of:

providing an RF coil adapted to transmit RF to and/or receive RF from a measuring volume, arranging the RF coil as a part of a non-tuned or non-tuned and non-matched radiofrequency circuit.

It is found that with the method of manufacturing a robust and accurate NMR spectroscopy device may be produced which is capable of one-dimensional and/or multi-dimensional heteronuclear spectroscopy measurements of a plurality of nuclides in real-time.

An NMR-device holder arranged for allowing the hosting of a fluidic chip, according to an aspect of the invention comprises a first side and a second side, wherein the first side is provided with a non-tuned RF circuit having electrical connection points for connecting to the NMR spectroscopy device as set forth in the foregoing;

and the second side is provided with fluidic connection points, wherein the holder is manufactured from a non-magnetic material, preferably aluminum.

It will be appreciated that any NMR-compatible material may be selected for manufacturing the holder. Preferably, the holder is manufactured from aluminum.

The NMR-device holder may be formed as an insert into a magnetic resonance apparatus, and as such placed in a static magnetic field, $B_0$. Preferably, holes are provided on the NMR-device holder, the first holes correspond to the electrodes on the first side and the second holes correspond to fluidic connection points on the second side. Preferably, the different NMR-devices are provided comprising a variable number of holes for accommodating different devices having different number of coils and electrodes.

The method of manufacturing a NMR-device holder as is set forth in the foregoing comprises the steps of:

adapting a holder body having a first side and a second side for allowing hosting of a fluidic chip;

providing the first side with electrical connection points;

providing the second side with fluidic connection points;

wherein the holder body is manufactured from of non-magnetic material, preferably aluminum It will be appreciated that the method of manufacturing the NMR-device holder or the device may comprise the step of providing a magnet for maintaining a substantially constant magnetic field in the measuring volume of the device. It will be further appreciated that the NMR spectroscopy device as is set forth in the foregoing may be connected to or maybe part of a fluidic network.

These and other aspects of the invention will be discussed with reference to drawings wherein like reference signs correspond to like elements. It will be appreciated that the drawings are presented for illustrative purposes only and may not be used for limiting the scope of the appended claims.

DETAILED DESCRIPTION OF THE DRAWINGS

FIG. 1 presents in a schematic way an embodiment of a NMR device according to an aspect of the invention. In view "a" a top view of the device is presented.

In a particular embodiment of the device 10 according to the invention, a 32-turn microcoil may have a low resistance ($\rho=7\Omega$) and may be connected directly to a coaxial cable without any tuning/matching circuit. It is found that such arrangement is technically meaningful for the following reasons.

First, a spiral coil, like a coaxial cable, can be shown to have broad-band characteristics and its impedance is remaining close to its DC value in the frequency range between 0 MHz up to about 500 MHz or more.

Secondly, the current passed from an RF source through a coaxial cable in a resistor R remains finite even when R tends to zero, despite the fact that the transmitted power also tends to zero due to power reflection.

Thirdly, the capability of the RF pulse to produce the oscillating excitation magnetic field $B_1$ (to be superposed on the constant magnetic field $B_0$ in the measuring volume) depends upon the transmitted current and not the transmitted power. It will be appreciated that usually the $B_1$ filed is orthogonal to the $B_0$ field. The $B_1$ field is in fact proportional to the current, and inversely proportional to the sample-to-coil distance. It has been found, both computationally and empirically, that the current passed through the unmatched (non-tuned) coil set-up is sufficient to produce a very usable $B_1$ excitation field in the measuring volume across the full frequency range, as is schematically depicted in the nutation experiments at $^2H$, $^{19}F$ and $^1H$ Larmor frequencies, see view "d" in FIG. 1. Once a reasonable value of $B_1$ is reached, the same set-up has also close-to-optimal detection efficiency due to the reciprocity theorem, described in Hoult, D. I. The principle of reciprocity in signal strength calculations—A mathematical guide. Concepts in Magnetic Resonance 12, 173-187 (2000). It is further found that during signal reception a low-impedance coil can in fact easily drive a 50Ω coaxial cable and load. Moreover, a further advantageous phenomenon is detected—the low impedance of the coil minimizes its Johnson noise.

$^1H$ and $^{19}F$, being so-called high-frequency nuclides, are widely addressed with NMR spectroscopy because of their relatively high sensitivity. It is found that with the device according to the invention detection of nuclides having low gyromagnetic ratios may be enabled. For example, it is found that with the device according to the invention NMR spectroscopy of $^2H$, $^{13}C$, $^{15}N$, $^{31}P$, $^7Li$, $^{11}B$, $^{29}Si$ is possible. In general, direction of nuclides of importance for biomolecular science, organic chemistry, bio- or inorganic chemistry, or material studies may be enabled with the device according to the invention.

Preferably, the device according to the invention is embodied as an insert into a standard magnetic resonance apparatus. This has an advantage that the magnet for providing the constant $B_0$ field may be avoided as the $B_0$ field of the NMR apparatus may be readily used.

View "b" of FIG. 1 presents in a schematic way an embodiment of a fluidic device 10a according to the invention. A suitable sample inlet/outlet 2 may be provided on a chip substrate 3. A fluidic channel 4 adapted to dwell in the measuring volume of the device 10a is preferably centered on the substrate 3. The coil 6 may be arranged on the bottom of the substrate 3, having typically between 1 and 50 turns. It will be appreciated that a suitable plurality of the copper electrodes 5 may be envisaged. It will be appreciated that a suitable plurality of coils 6 may be envisaged. The copper electrodes are preferably provided using suitable lithographic method. An equivalent electrical circuit of the device 10a is schematically presented in view "c".

It is found that the device according to the invention enables carrying out of the NMR experiments at any particular static magnetic field strength ($B_0$). More in particular, the data acquisition sequence may comprise sequences for heteronuclear 1D and nD experiments and/or sequences including decoupling with the Larmor frequency of a nuclide coupled to the direct-detected nuclide.

Figure 1A:
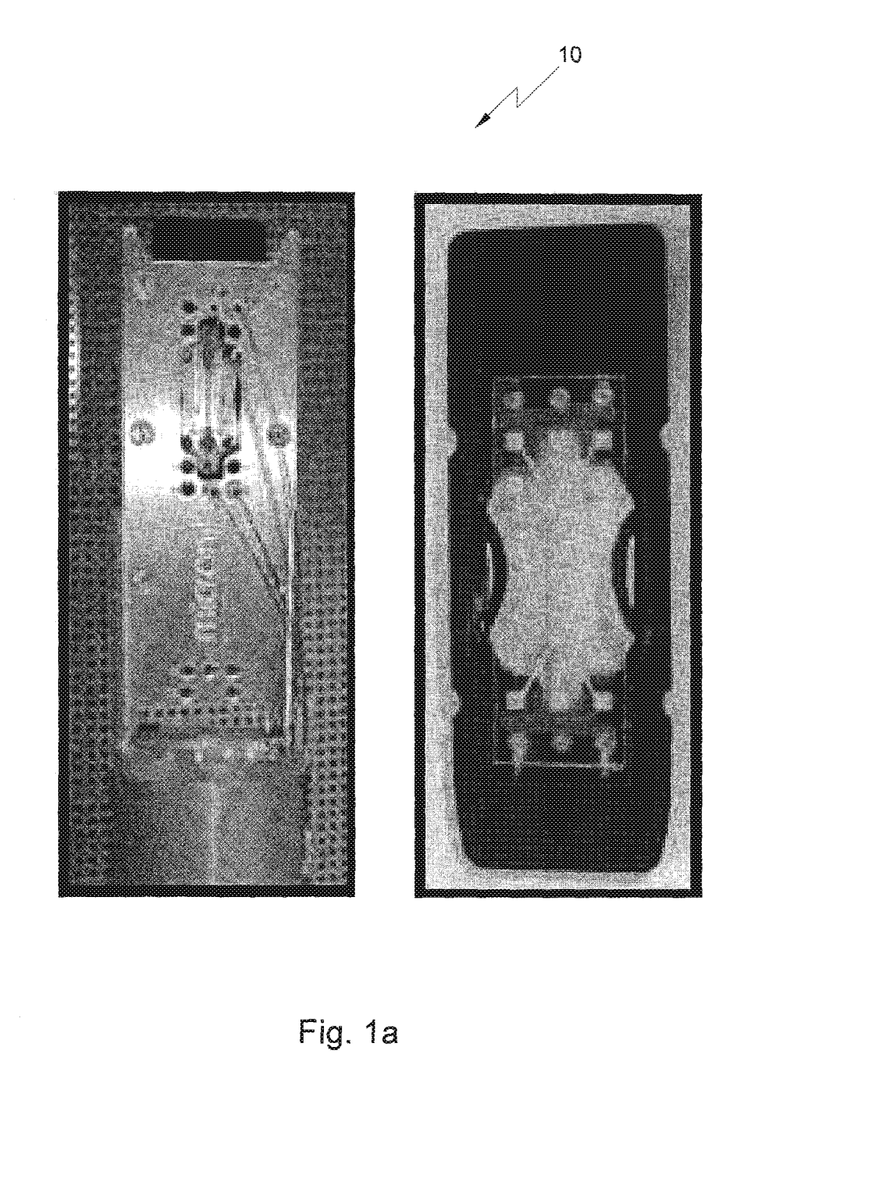
FIG. 1 presents in a schematic way an embodiment of an NMR device according to an aspect of the invention.
Figure 1B:
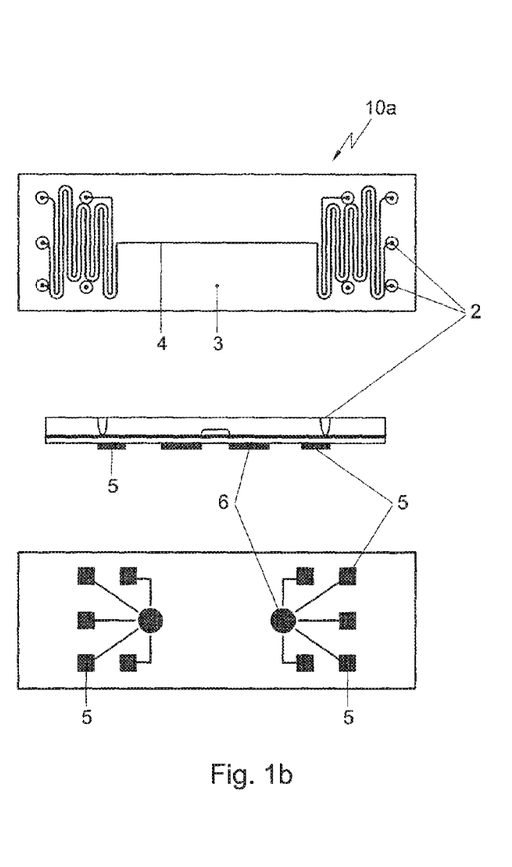
Figure 1C:
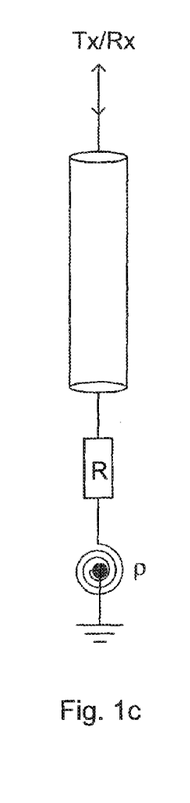
Figure 1D:
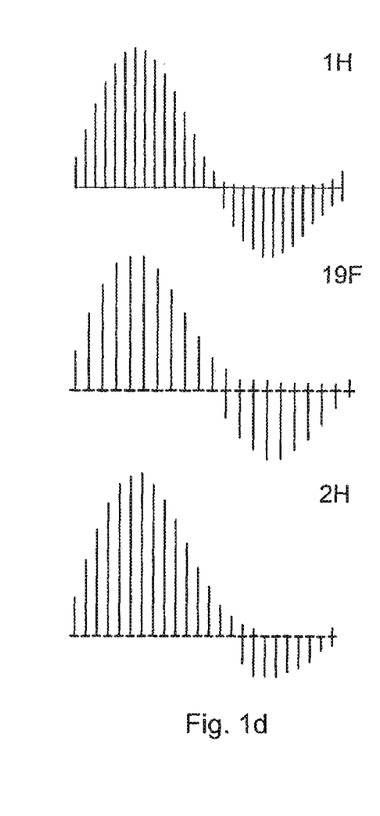
Figure 2:
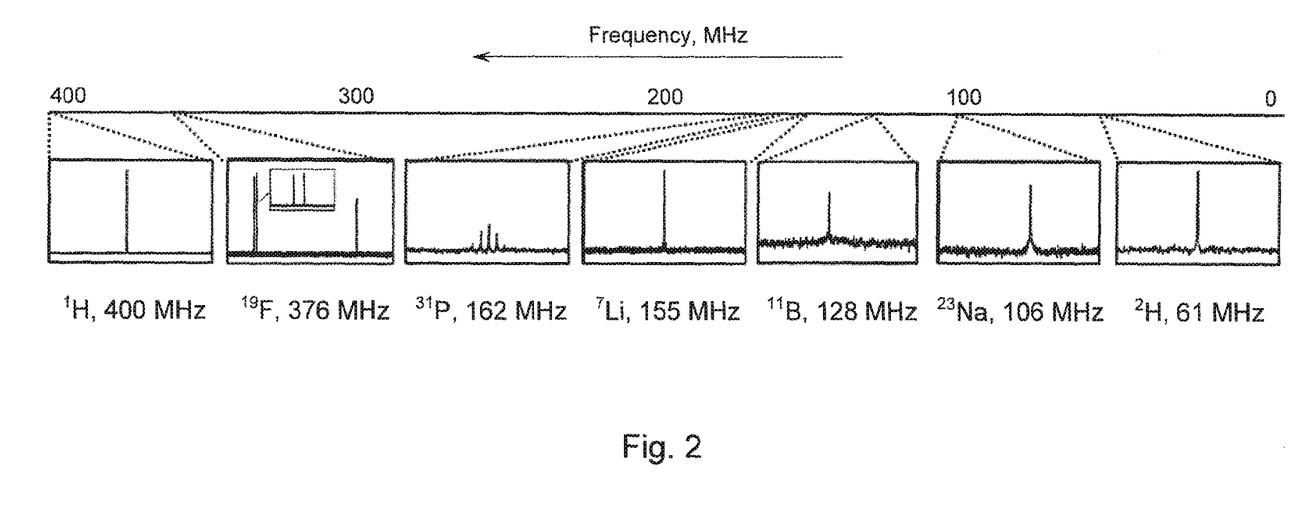
FIG. 2 presents seven spectra for seven different nuclides comprised in the same sample which have been acquired using the device of FIG. 1.

FIG. 2 presents seven spectra for seven different nuclides comprised in the same sample which have been acquired using the device of FIG. 1. In order to demonstrate the broad-band character of the device according to the invention, spectra of seven different nuclides present in the same sample were sequentially recorded in the 400-61 MHz frequency range, measuring, consecutively $^1$H, $^{19}$F, $^{31}$P, $^7$Li, $^{11}$B, $^{23}$Na and $^2$H.

The good operational performance of the device according to the invention is illustrated by the 30 kHz wide $^{19}$F NMR spectrum showing the $BF_4$ and $PF_6$ anion signals, the latter appearing to the same coupling constant observed in the doublet with characteristic $^1J_{PF}$ coupling of 710 Hz, corresponding to the same coupling constant observed in the multiplet in the $^{31}$P spectrum.

It is found that the signal to noise ratio of the RF coil forming part of a non-tuned circuit used in the device according to the invention is comparable to the signal to noise ratio found in the state of the art coils used in tuned circuits. In accordance with an aspect of the invention the NMR spectroscopy device may comprise a plurality of coils, which may be adapted to be addressed sequentially and/or contemporaneously. More in particular, the said plurality of coils can be part of a non-tuned radiofrequency circuit, or wherein at least one of the said plurality of coils is part of the non-tuned radiofrequency circuit. In the latter configuration one or more of the remaining coils may be tuned to a particular Larmor frequency.

Less NMR-sensitive nuclides, such as $^{13}$C, are generally detected using indirect-detection techniques in which the spectral information of the less-sensitive nuclide is recovered from its effect on the more sensitive nuclide, assuming they are coupled. To carry out such experiments one must generally employ different probes or a special probe containing separate coils and/or tuning and matching circuits for the individual nuclides to be addressed.

The broad-band nature of the device according to the invention enables execution of ubiquitously employed heteronuclear 2D NMR experiments, with the single non-tuned NMR coil addressing frequencies of different nuclides, having Larmor frequencies separated by hundreds of MHz. Most popular 2D experiments include HSQC (heteronuclear single-quantum coherence) and HMBC (heteronuclear multiple-bond coherence) experiments, performed to assign the proton-carbon backbone of organic molecules. The good performance and straightforward handling of the non-tuned coil set-up has been proven by inventors carrying out the full set of per se standard experiments, such as $^1$H$^1$H-COSY, $^1$H$^1$H-NOESY, $^1$H$^{13}$C-HSQC and $^1$H$^{13}$C-HMBC, performed on a 18 µg sample of ethylcinnamate. The heteronuclear 2D experiments with the device according to the invention permit full assignment of all $^1$H and $^{13}$C signals at natural abundance levels of these isotopes.

As a further illustration of the capabilities of the device according to the invention $^{19}$F measurements may be performed for samples from medicinal chemistry, polymers, agrochemistry, MRI contrast agents.

$^1$H$^{13}$C-HSQC, $^1$H$^{13}$C-HMBC, $^{19}$F$^{13}$C-HSQC, $^{19}$F$^{13}$C-HMBC measurements have been carried out on a trifluoroethanol sample using the device according to the invention. The acquired data demonstrated detailed information on all the one-bond, two-bond and three-bond coupling constants. Particularly informative are the cross peaks in the HMBC spectra, which show complex multiplet patterns that are both skewed but in opposite directions attributable to the fact that the $^{19}$F-$^{13}$C and $^1$H-$^{13}$C coupling constants have opposite signs. It has been demonstrated that the device according to the invention is capable of providing similar results in terms of quality and sensitivity compared to the conventional (tuned) systems.

In addition, it is found that the device according to the invention is particularly suitable for carrying out measurements targeting urinary excretion of taurine. Still in addition, a direct detection of the trifluoromethylphenol is possible using the device according to the invention due to its high sensitivity to $^{19}$F. A detection limit of about 100 picomole is found to be feasible for the device according to the invention.

Summarizing, a front end of the device according to the invention comprising a (micro)coil-on a chip terminating a coaxial cable with no tuning and matching circuitry functions as a high-resolution versatile coil NMR system with broad-band character enabling execution of mono- and multi-dimensional heteronuclear data acquisition.

The device according to the invention may be used in medical applications, in forensic studies, in measuring (neat) biofluids without using additives or deuterated solvents, which are usually compulsory in the state of the art NMR spectroscopic systems.

The device according to the invention may be embodied as an insert into a magnetic resonance apparatus, or may be used as a stand-alone portable or table-top system. The device according to the invention may further be integrated with other lab-on-chip platforms supporting different applications for on-line monitoring of chemical reactions or for enabling rapid analysis of biological fluids.

Figure 3:
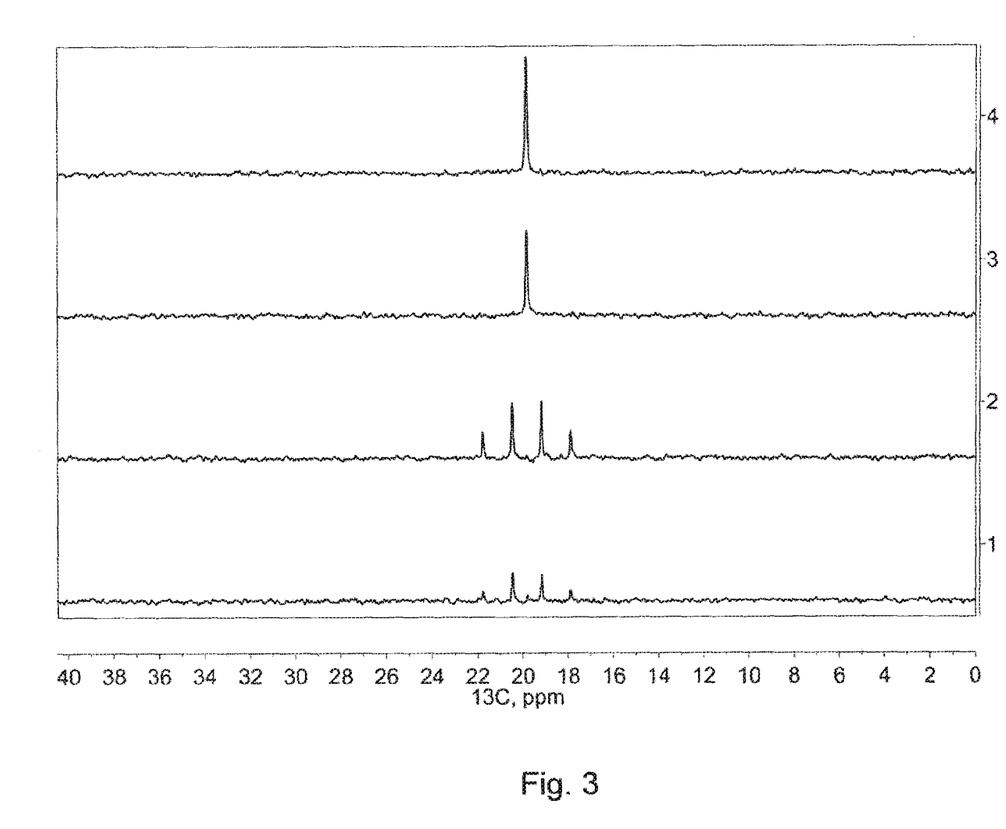
FIG. 3 presents in a schematic way an example of $^{13}C$ spectra acquired for different NOE and/or decoupling schemes.

FIG. 3 presents in a schematic way an example of $^{13}$C spectra acquired for different decoupling schemes. Each experiment was acquired with 128 scans, total acquisition time was about 9 minutes.

The presented spectra are obtained from neat acetic acid-2-$^{13}$C, using the following decoupling schemes:
1) spectrum 1 is acquired with no decoupling;
2) spectrum 2 is acquired with no decoupling with NOE enhancement;
3) spectrum 3 is acquired with NOE enhancement;
4) spectrum 4 is acquired with decoupling and NOE enhancement.

It will be appreciated that different NOE enhancement schemes may be envisaged. For example, a Steady State may be used. In this mode a single resonance is saturated at low power before acquiring the FID. Alternatively, a truncated driven NOE (TOE) may be envisaged. This mode is as Steady State, but is saturated for various shorter times so the buildup of NOE can be observed. Still alternatively, Transient NOE may be envisaged. In this mode a single resonance may be selectively inverted or all resonances may be frequency labeled by a 90 degree pulse and a variable delay. The NOE acquisition mode is known per se and will not be explained in further details.

Figure 4:
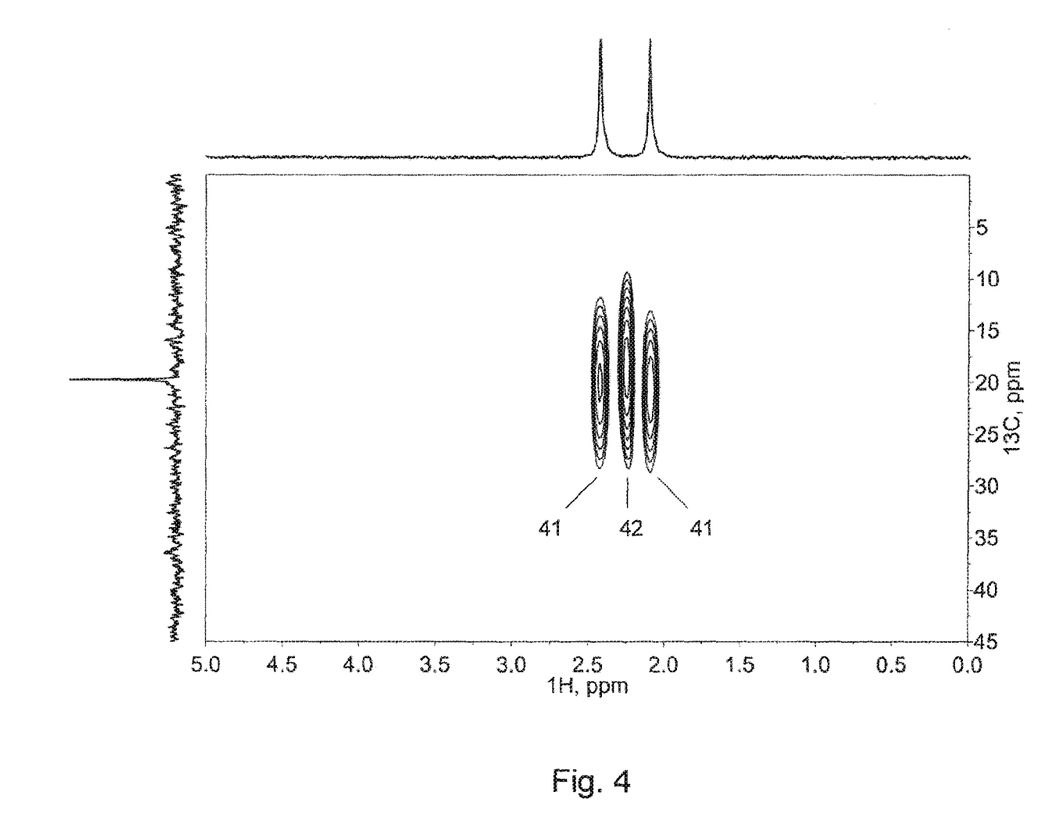
FIG. 4 presents in a schematic way an embodiment of $^1H$-$^{13}C$-HSQC spectra obtained from neat acetic acid-2-$^{13}C$.

FIG. 4 presents in a schematic way an embodiment of $^1$H-$^{13}$C spectra obtained from neat acetic acid-2-$^{13}$C. In this embodiment $^1$H-$^{13}$C HSQC coupled acquisition (see item 41), 16 increments in the indirect detection and 4 scans per increment was carried out, acquisition time 3 minutes.

Spectrum 42 relates to a decoupled acquisition, wherein 8 increments in the indirect detection and 4 scans per increment were used, the acquisition time was 2 minutes.

Figure 5:
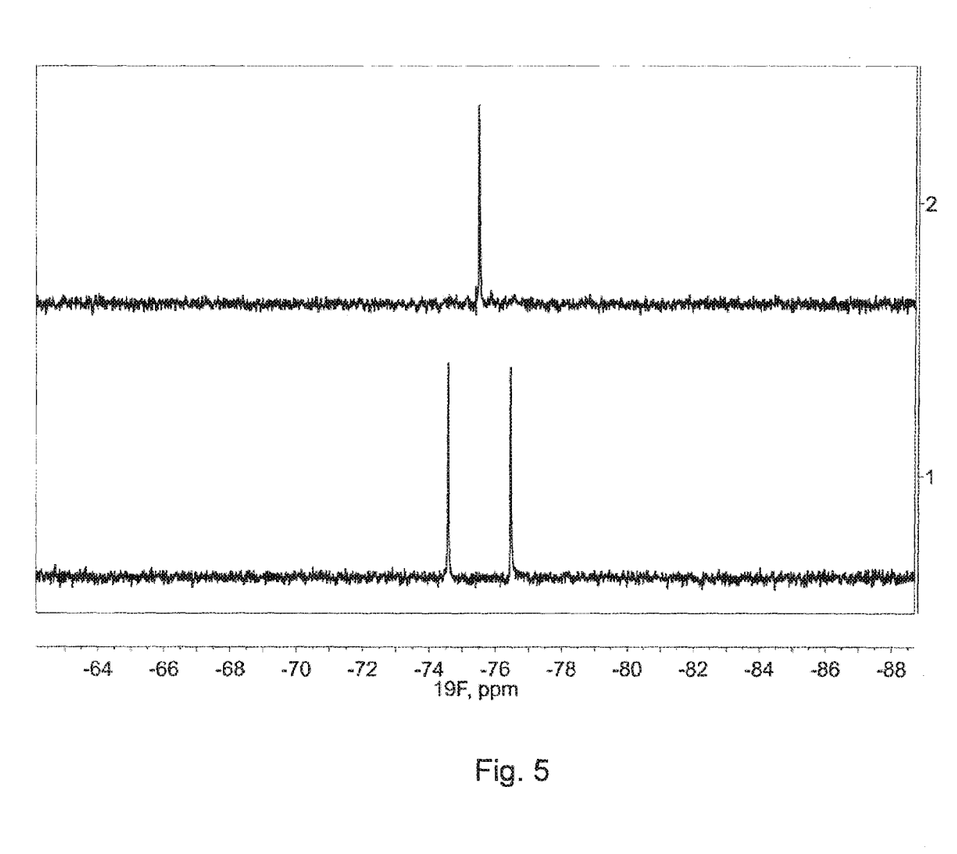
FIG. 5 presents in a schematic way an embodiment of $^{19}F$ spectra.

FIG. 5 presents in a schematic way an embodiment of $^{19}$F spectra. The source was 1M NaPF$_6$ dissolved in water. Spectrum (1) shows coupled results while spectrum (2) shows decoupled results.

Figure 6:
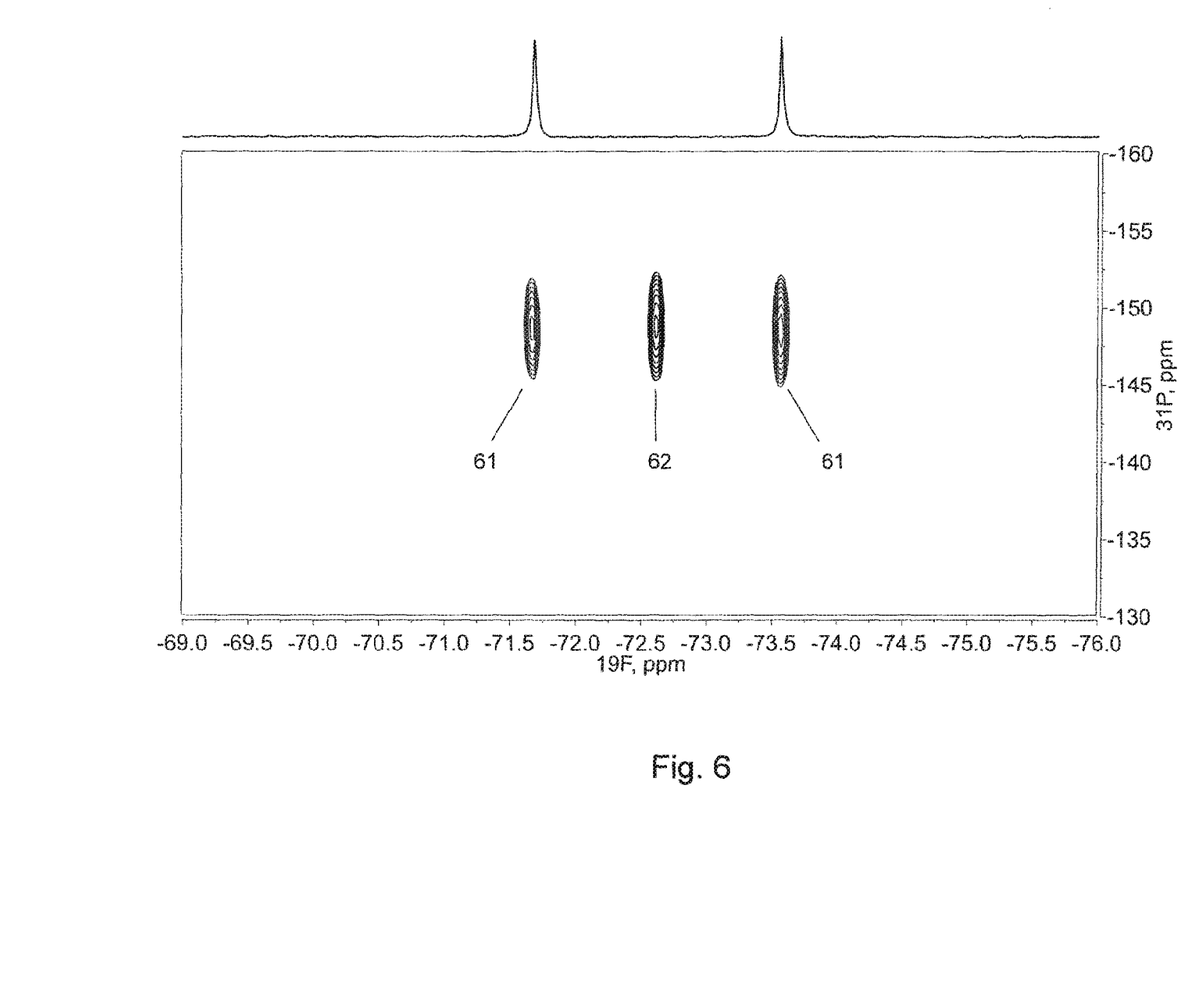
FIG. 6 presents in a schematic way an embodiment of $^{19}F^{31}P$-HSQC spectra.

FIG. 6 presents in a schematic way an embodiment of $^{19}$F$^{31}$P spectra. Items 61 depict $^{19}$F$^{31}$P-HSQC coupled acquisition, 8 increments in the indirect detection and 8 scans per increment, acquisition time 3 minutes. Item 62 depicts a decoupled acquisition, 8 increments in the indirect detection and 8 scans per increment, acquisition time 3 minutes. The source was 1M NaPF$_6$ dissolved in water.

While specific embodiments have been described above, it will be appreciated that the invention may be practiced otherwise than as described. Moreover, specific items discussed with reference to any of the isolated drawings may freely be inter-changed supplementing each outer in any particular way. The descriptions above are intended to be illustrative, not limiting. Thus, it will be apparent to one skilled in the art that modifications may be made to the invention as described in the foregoing without departing from the scope of the claims set out below.

The invention claimed is:

1. A Nuclear Magnetic Resonance (NMR) spectroscopy device for carrying out one dimensional and/or multidimensional heteronuclear spectroscopy measurements of a plurality of nuclides, the NMR spectroscopy device comprising:
   a magnet for maintaining a substantially constant magnetic field in a measuring volume; and
   a fluidic device, including a chip substrate, wherein a micro-coil is provided on the chip substrate, the micro-coil being an RF coil adapted to transmit RF radiation to and/or receive RF radiation from the measuring volume,
   wherein the micro-coil connects to and forms part of a non-tuned non-matched radiofrequency circuit.

2. The NMR spectroscopy device according to claim 1, wherein the RF coil has a detection volume of less than 1 milliliter.

3. The NMR spectroscopy device of claim 2, wherein the detection volume is less than 100 microliters.

4. The NMR spectroscopy device of claim 3, wherein the detection volume is less than 100 nanoliters.

5. A method of carrying out Nuclear Magnetic Resonance (NMR) one dimensional and/or multidimensional heteronuclear spectroscopy measurements of a plurality of nuclides, the method comprising the steps of:
   providing a sample comprising a plurality of nuclides in the measuring volume of the NMR spectroscopy device of claim 1;
   executing a data acquisition sequence on the NMR spectroscopy device;
   acquiring data from the sample pursuant to said data acquisition sequence.

6. The method according to claim 5, wherein the data acquisition sequence includes decoupling on one of the nuclides' Larmor frequencies.

7. The NMR spectroscopy device of claim 1, further comprising holder configured for allowing the hosting of the fluidics device, said holder comprising a first side and a second side, wherein
   the first side is provided with a non-tuned RF circuit having electrodes for connecting to the fluidic device;
   and the second side is provided with fluidic connection points,
   wherein the holder is manufactured from a non-magnetic material.

8. The NMR-device holder according to claim 7, comprising first holes and second holes, the first holes correspond to the electrodes on the first side and the second holes correspond to fluidic connection points on the second side.

9. The NMR spectroscopy device of claim 7, wherein the holder is manufactured from aluminum.

10. The NMR spectroscopy device of claim 1, wherein the micro-coil is a spiral coil.

11. The NMR spectroscopy device of claim 1, further comprising a sample inlet/outlet provided on the chip substrate.

12. The NMR spectroscopy device of claim 11, wherein a fluidic channel, configured to dwell in the measuring volume, is centered on the chip substrate.

13. The NMR spectroscopy device of claim 11, wherein the micro-coil is positioned on a bottom of the chip substrate.

* * * * *